(12) United States Patent
Notohardjono et al.

(10) Patent No.: US 12,274,017 B2
(45) Date of Patent: Apr. 8, 2025

(54) VIBRATION ISOLATION FASTENER SYSTEM

(71) Applicant: INTERNATIONAL BUSINESS MACHINES CORPORATION, Armonk, NY (US)

(72) Inventors: Budy Notohardjono, Poughkeepsie, NY (US); Richard M. Ecker, Poughkeepsie, NY (US); Suraush Khambati, Poughkeepsie, NY (US); Shawn Canfield, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 321 days.

(21) Appl. No.: 18/056,769

(22) Filed: Nov. 18, 2022

(65) Prior Publication Data

US 2024/0172384 A1 May 23, 2024

(51) Int. Cl.
*H05K 7/14* (2006.01)
*F16B 12/32* (2006.01)
*H05K 7/18* (2006.01)

(52) U.S. Cl.
CPC ............ *H05K 7/1411* (2013.01); *F16B 12/32* (2013.01); *H05K 7/1489* (2013.01); *H05K 7/183* (2013.01)

(58) Field of Classification Search
CPC .... H05K 7/1411; H05K 7/1489; H05K 7/183; F16B 12/32; F16F 1/3732; F16F 1/38; A47B 88/43; G11B 33/08
See application file for complete search history.

(56) References Cited

U.S. PATENT DOCUMENTS

| | | | | |
|---|---|---|---|---|
| 5,721,457 A | * | 2/1998 | Sri-Jayantha | .......... G11B 33/08 307/65 |
| 6,523,918 B1 | | 2/2003 | Baiza | |
| 6,595,379 B1 | * | 7/2003 | Powell | .................... F16B 21/09 403/321 |
| 6,682,282 B2 | | 1/2004 | Allen | |
| 6,719,482 B2 | * | 4/2004 | Morita | .................. F16B 5/0258 267/141 |

(Continued)

FOREIGN PATENT DOCUMENTS

| CN | 203734980 U | 7/2014 |
|---|---|---|
| CN | 107606018 B | 6/2019 |

(Continued)

*Primary Examiner* — Patrick D Hawn
(74) *Attorney, Agent, or Firm* — Matthew Zehrer (57) ABSTRACT

A fastener system includes a bar, a knob, a bushing, and a washer. The bar extends along an axis and includes a catch at one end and a head at the other end, where the head includes an inclined face. The knob is configured to engage with the catch to prevent relative rotation between the knob and the bar and to prevent separation of the knob and the bar along the axis. The bushing is comprised of an elastomeric material that is positioned around the bar between the catch and the head, where the bushing includes a flange facing the knob. The washer is positioned around the bar between the bushing and the head, where the washer includes an inclined face that contacts the other inclined face. The coefficient of friction between the bushing and the washer is higher than the coefficient of friction between the washer and the head.

20 Claims, 8 Drawing Sheets

(56) References Cited

U.S. PATENT DOCUMENTS

| | | | |
|---|---|---|---|
| 7,694,926 B2 | 4/2010 | Allen | |
| 7,930,812 B2 | 4/2011 | Curnalia | |
| 8,146,756 B2 | 4/2012 | Brock | |
| 8,322,974 B2 | 12/2012 | Chen | |
| 8,474,804 B2 * | 7/2013 | Masterson | F16F 15/08 |
| | | | 267/141 |
| 8,562,086 B1 * | 10/2013 | Baik | A47B 88/931 |
| | | | 312/334.4 |
| 9,075,217 B2 * | 7/2015 | Giraud | G02B 6/44528 |
| 9,520,158 B1 * | 12/2016 | Lyu | G11B 33/124 |
| 9,743,767 B1 * | 8/2017 | Easton | A47B 88/43 |
| 9,918,398 B2 | 3/2018 | Okumura | |
| 9,930,805 B2 * | 3/2018 | Chen | A47B 96/068 |
| 10,278,498 B2 * | 5/2019 | Chen | A47B 88/483 |
| 10,925,392 B2 * | 2/2021 | Chen | H05K 7/1489 |
| 12,163,566 B2 * | 12/2024 | Hu | F16F 15/085 |
| 2005/0285493 A1 | 12/2005 | Hu | |
| 2011/0001280 A1 * | 1/2011 | Huang | F16F 1/3732 |
| | | | 267/140.4 |
| 2013/0026113 A1 * | 1/2013 | Fan | H05K 7/1489 |
| | | | 211/26 |
| 2013/0048813 A1 * | 2/2013 | Liu | G06F 1/187 |
| | | | 248/222.11 |

FOREIGN PATENT DOCUMENTS

| | | | | |
|---|---|---|---|---|
| CN | 110552982 | A | | 12/2019 |
| EP | 2366910 | B1 | | 11/2012 |
| JP | 2007186328 | A | * | 7/2007 |
| WO | WO-2018098837 | A1 | * | 6/2018 |

\* cited by examiner

VIBRATION ISOLATION FASTENER SYSTEM

BACKGROUND

The present disclosure relates to fasteners, and more specifically, to fasteners that provide vibration isolation.

Within a datacenter, there can be many server racks that each include several computer servers. In traditional systems, the servers are supported on two opposite sides using two-part fasteners, such as nuts and bolts or pins and clips. However, such fasteners can be difficult to install given the heavy weight of the servers. In addition, there can be shocks and vibration transmitted through traditional fasteners, which can cause failures, for example, in the wire connections to and from the servers. An additional difficulty is that different server racks can have mounting holes with different sizes and/or shapes.

SUMMARY

According to one embodiment of the present disclosure, a fastener system includes a bar, a knob, a bushing, and a washer. The bar extends along an axis and includes a catch at one end and a head at the other end, where the head includes an inclined face. The knob is configured to engage with the catch to prevent relative rotation between the knob and the bar and to prevent separation of the knob and the bar along the axis. The bushing is comprised of an elastomeric material that is positioned around the bar between the catch and the head, where the bushing includes a flange facing the knob. The washer is positioned around the bar between the bushing and the head, where the washer includes an inclined face that contacts the other inclined face. The coefficient of friction between the bushing and the washer is higher than the coefficient of friction between the washer and the head.

According to another embodiment of the present disclosure, a server rack includes a base, rails extending from the base, and a server assembly. The server assembly is connected to the rails by fasteners, where each fastener extends through a wing on the server and one of the rails. Each fastener includes a bar, a knob, a bushing, and a washer. The bar extends along an axis and includes a catch at one end and a head at the other end, where the head includes an inclined face. The knob is configured to engage with the catch to slidably connect the knob and the bar. The bushing is comprised of an elastomeric material that is positioned around the bar between the catch and the head. The washer is positioned around the bar between the bushing and the head, where the washer includes a second inclined face that contacts the first inclined face.

According to another embodiment of the present disclosure, a server assembly includes an electronic component, a chassis housing the electronic component, the chassis comprising a wing extending outwards with an aperture, and a fastener extending through the aperture. The fastener includes a bar, a knob, a bushing, and a washer. The bar extends along an axis and includes a catch at one end and a head at the other end, wherein the head includes an inclined face. The knob is configured to engage with the catch to prevent relative rotation between the knob and the bar and to prevent separation of the knob and the bar along the axis. The bushing is comprised of an elastomeric material that is positioned around the bar between the catch and the head, where the bushing includes a flange facing the knob. The washer is positioned around the bar between the bushing and the head, where the washer includes an inclined face that contacts the other inclined face. The fastener is retained by the wing due to the wing being positioned between the knob and the flange, and due to the aperture being smaller than the knob and the flange.

DETAILED DESCRIPTION

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising," "includes," "including," "has," "having," "contains," or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing Figures. The terms "overlying," "atop," "on top," "positioned on," or "positioned atop" mean that a first element, such as a first structure, is present on a second element, such as a second structure, wherein intervening elements such as an interface structure can be present between the first element and the second element.

Figure 1:
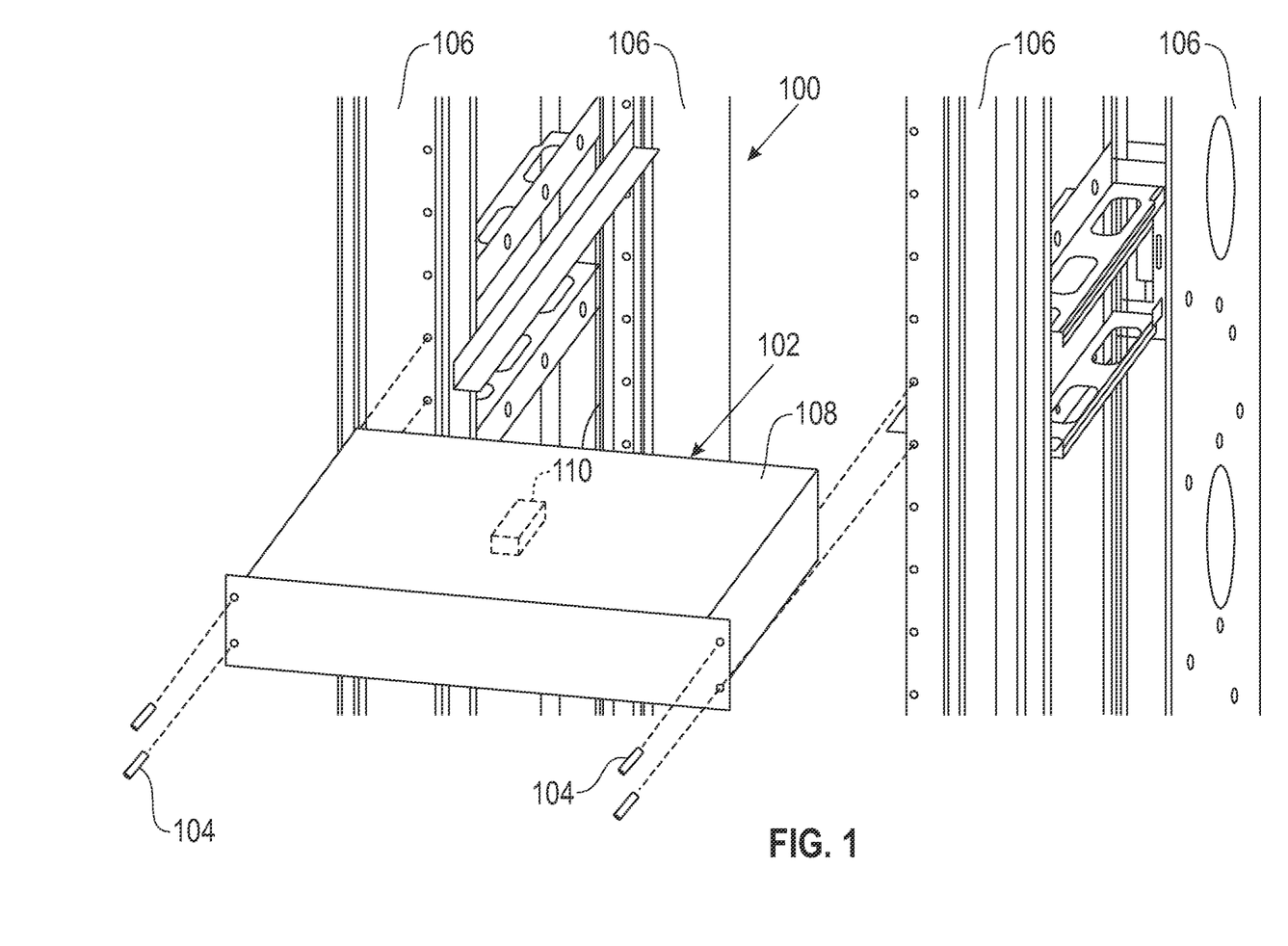
FIG. 1 is a front perspective view of a server rack, server assembly, and fasteners, in accordance with an embodiment of the present disclosure.

FIG. 1 is a front perspective view of a server rack 100, server assembly 102, and fasteners 104. In the illustrated embodiment, server rack 100 comprises a base (not shown) and rails 106 extending upwards therefrom. Rails 106 are parallel to one another and support a stack of server assemblies 102 (although only one server assembly 102 is shown in FIG. 1). More specifically, server assembly 102 is connected to rails 106 using a plurality of fasteners 104 (e.g., four fasteners 104). In some embodiments, the mounting interface between server rack 100 and server assembly 102 is in accordance with a standard set forth by the Electronic Industries Association (EIA). In addition, server assembly 102 includes chassis 108 which surrounds electronic component 110 (e.g., a computer).

Figure 2A:
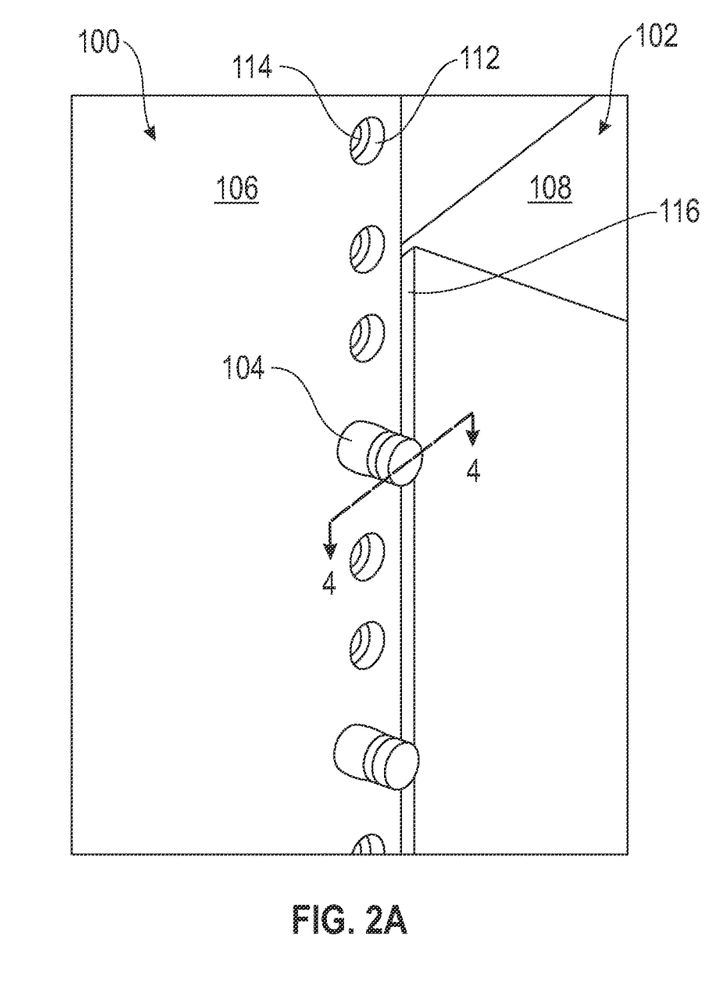
FIG. 2A is a close-up rear perspective view of the server rack, server assembly, and fasteners, in accordance with an embodiment of the present disclosure.

FIG. 2A is a close-up rear perspective view of server rack 100, server assembly 102, and fasteners 104. In the illustrated embodiment, rails 106 include an array of round holes 112 placed at a standard distances, for example, according to EIA-310. Server assembly 102 includes a corresponding array of round holes 114 placed in wings 116 of chassis 108, wherein the diameter of holes 114 is within ten percent of the diameter of holes 112. Fasteners 104 extend through one or more of the pairs of holes 112/114 to connect server assembly 102 to server rack 100.

Figure 2B:
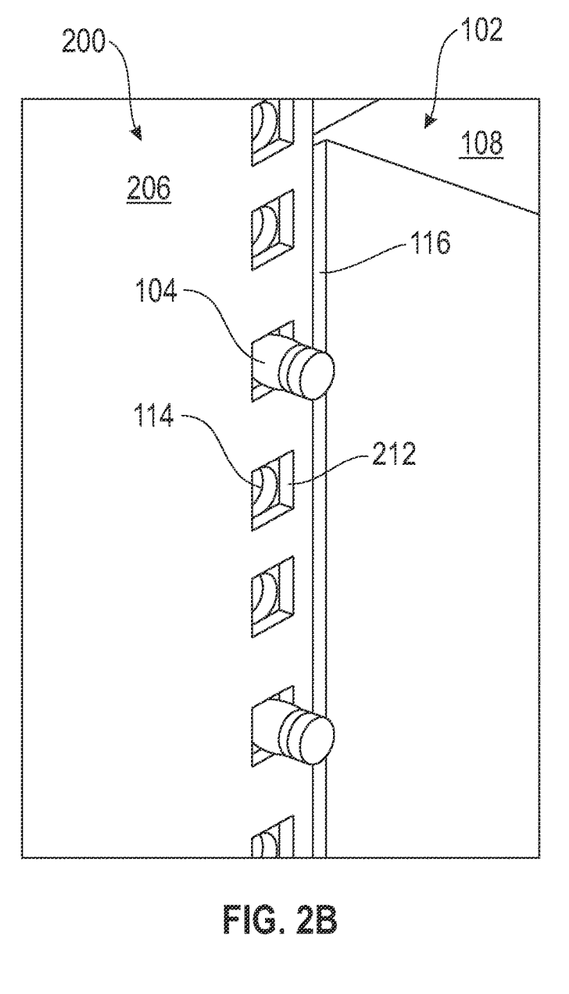
FIG. 2B is a close-up rear perspective view of an alternate embodiment server rack, server assembly, and fasteners, in accordance with an embodiment of the present disclosure.

FIG. 2B is a close-up rear perspective view of an alternate embodiment server rack 200, server assembly 102, and fasteners 104. In the illustrated embodiment, rails 206 include an array of square holes 212 placed at a standard distances, for example, according to EIA-310. Server assembly 102 includes a corresponding array of round holes 114 placed in wings 116 of chassis 108, wherein the diameter of holes 114 is within ten percent of the width of holes 212. Fasteners 104 extend through one or more of the pairs of holes 212/114 to connect server assembly 102 to server rack 100. Due to the design of fasteners 104, it doesn't matter whether the shape of the mounting holes 112/212 and/or 114 is round or square.

Figure 2C:
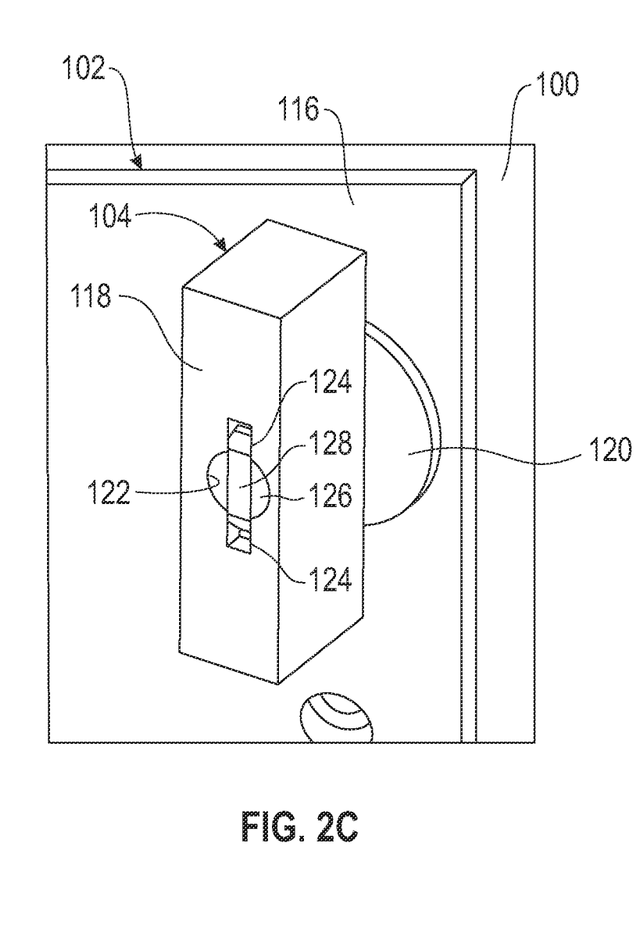
FIG. 2C is a close-up front perspective view of the server rack, server assembly, and one fastener, in accordance with an embodiment of the present disclosure.

FIG. 2C is a close-up front perspective view of server rack 100, server assembly 102, and one fastener 104. In the illustrated embodiment, fastener 104 includes knob 118 which includes pad 120 on the inner side. Pad 120 contacts wing 116 with an increased amount of surface area compared to the rest of knob 118. Knob 118 also includes bore 122 and recesses 124. Bore 122 extends through knob 118 to allow bar 126 to extend through knob 118. Recesses 124 extend into the outer side of knob 118 to allow toggle 128 to prevent relative rotation between knob 118 and bar 126. Furthermore, knob 118 has an elongated shape so that a user can twist knob 118 and bar 126 together, for example, one-hundred-eighty degrees, to fasten server assembly 102 to server rack 100.

Figure 3A:
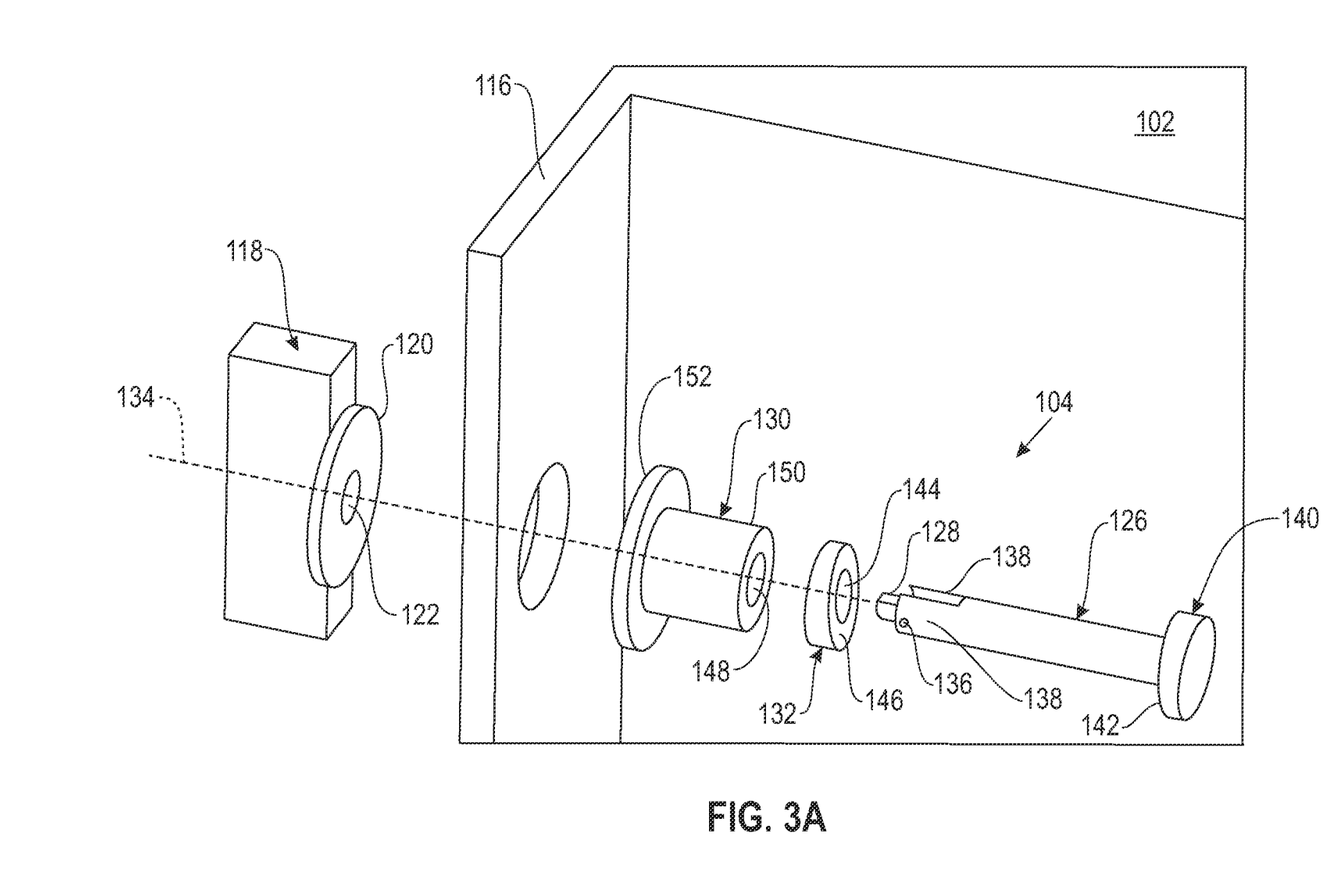
FIG. 3A is an exploded view of the fastener, in accordance with an embodiment of the present disclosure.

FIG. 3A is an exploded view of fastener 104. In the illustrated embodiment, fastener 104 is shown in relation to wing 116 since fastener 104 can be connected to server assembly 102 prior to connecting server assembly 102 to server rack 100 (shown in FIG. 1). Fastener 104 comprises knob 118, bar 126, bushing 130, and washer 132. Knob 118 is a rigid, strong component comprising, for example, a metal material, and knob 118 includes pad 120, bore 122, and recesses 124 (shown in FIG. 2C) (although in some embodiments, pad 120 is a separate component from knob 118). Bar 126 is a rigid, strong component comprising, for example, a metal material, and bar 126 extends along axis 134 and includes toggle 128, pin 136, ears 138, and head 140. More specifically, toggle 128 is rotatably connected to ears 138 by pin 136. At the opposite end of bar 126, head 140 is an enlarged portion of bar 126 which includes face 142 that is oriented generally towards toggle 128. However, face 142 is inclined or beveled such that it is non-perpendicular to axis 134.

In the illustrated embodiment, washer 132 is a rigid, strong component comprising, for example, a metal material, and washer 132 includes bore 144 and face 146. Face 146 is inclined or beveled such that it is non-perpendicular to axis 134. When bar 126 and washer 132 are rotationally aligned, the angle of inclination of face 146 can be supplementary to that of face 142 such that the two angles together add up to one-hundred-eighty degrees. Thereby, in the illustrated orientation, faces 142 and 146 contact each other along their entire surfaces.

In the illustrated embodiment, bushing 130 is a flexible, elastic component comprising, for example, an elastomeric polymer material (e.g., having a Shore A durometer hardness of between 30 and 50 or between 35 and 45), and bushing 130 includes bore 148, collar 150, and flange 152 facing wing 116 and knob 118.

Figure 3B:
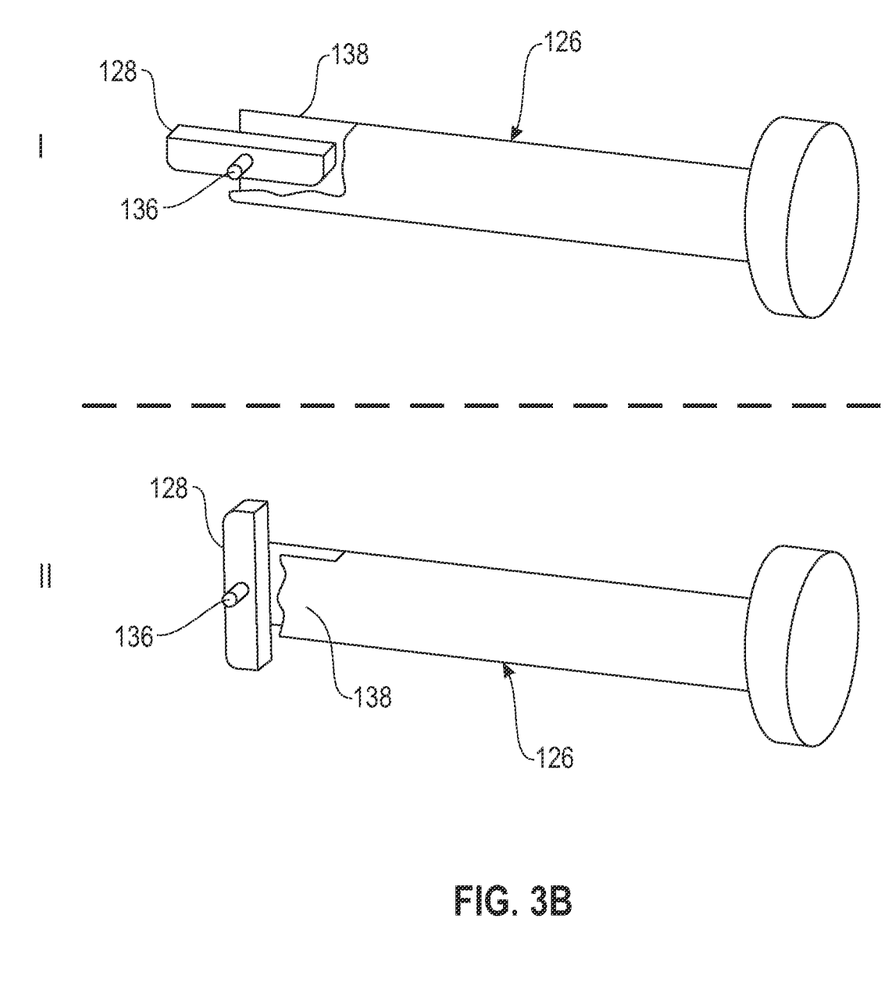
FIG. 3B is two broken-out views of a bar with a toggle, in accordance with an embodiment of the present disclosure.

FIG. 3B is two views of bar 126 with toggle 128 and pin 136 wherein the near-side ear 138 has been broken-out. In the illustrated embodiment of View I, toggle 128 is oriented in an installation position such that bar 126 can be passed through bores 122, 144, and 148. In View II, toggle 128 is oriented in a latched position such that toggle 128 can engage with recesses 124 (shown in FIG. 2C) to rotationally lock bar 126 and knob 118 together.

Figure 4:
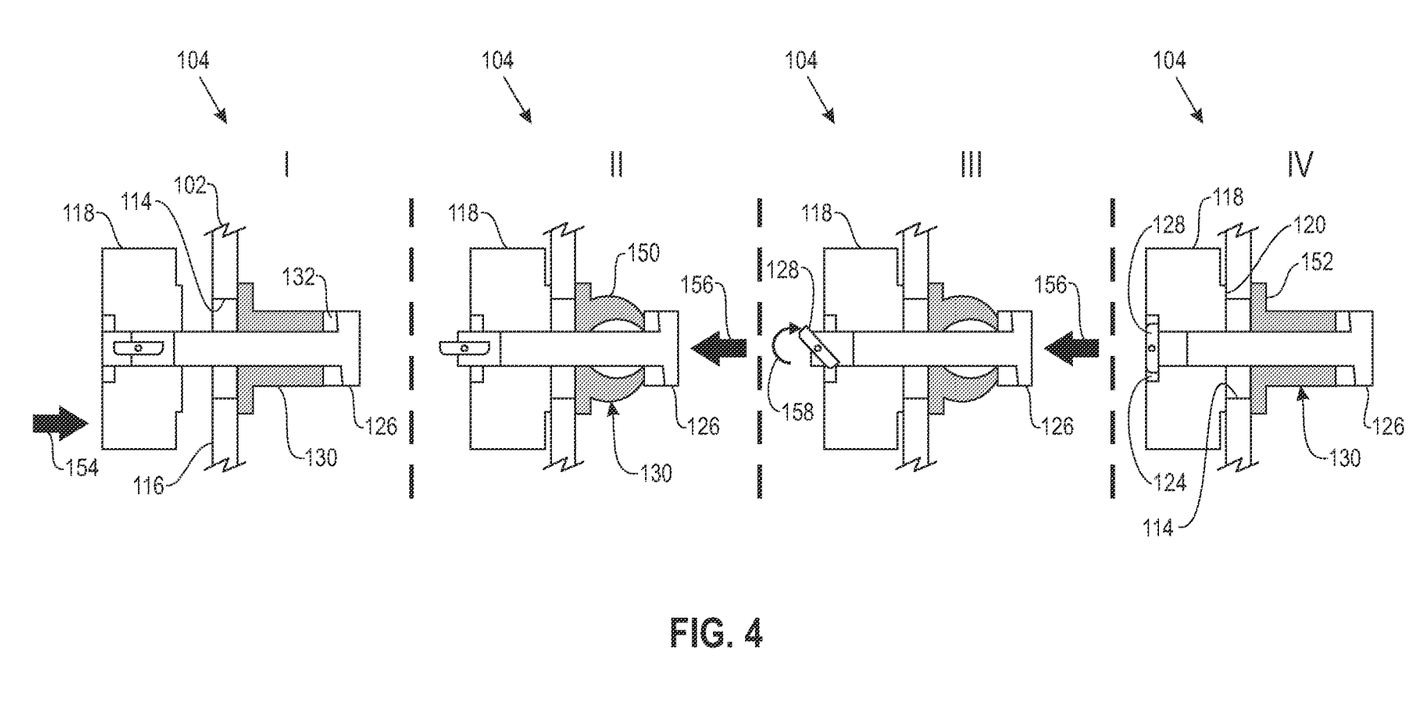
FIG. 4 is a series of cross-section views indicated by line 4-4 in FIG. 2A showing the assembly of the fastener and its connection to the server assembly, in accordance with an embodiment of the present disclosure.

FIG. 4 is a series of cross-section views indicated by line 4-4 in FIG. 2A showing the assembly of fastener 104 and its connection to server assembly 102. In the illustrated embodiment of View I, washer 132 and bushing 130 have been positioned on bar 126, and then bar 126 has been positioned through hole 114 in wing 116. While bar 126 is held in place, knob 118 is moved in direction 154 onto bar 126. In View II, knob 118 is held in place while bar 126 is moved in direction 156. Bar 126 can move in direction 156 because bushing 130 can be elastically deformed, for example, by collar 150 ballooning outwards, to make bushing 130 shorter. In View III, bar 126 has been moved in direction 156 enough for toggle 128 to clear knob 118. Thereby, toggle 128 can be rotated in direction 158 from the installation position to the latched position.

In the illustrated embodiment of View IV, force in directions 154 and 156 has been released from fastener 104, so bushing 130 can return to its original shape. This draws toggle 128 into recesses 124. In this configuration, toggle 128 functions as a catch to prevent knob 118 from separating from (i.e., coming off of) bar 126. In addition, fastener 104 is connected to server assembly 102 because pad 120 and flange 152 are larger than hole 114. Thereby, fastener 104 can be preinstalled in server assembly 102 prior to positioning server assembly 102 alongside server rack 100 (shown in FIG. 1). This can be advantageous because some server assemblies 102 can be heavy (e.g., 100 kilograms).

Figure 5:
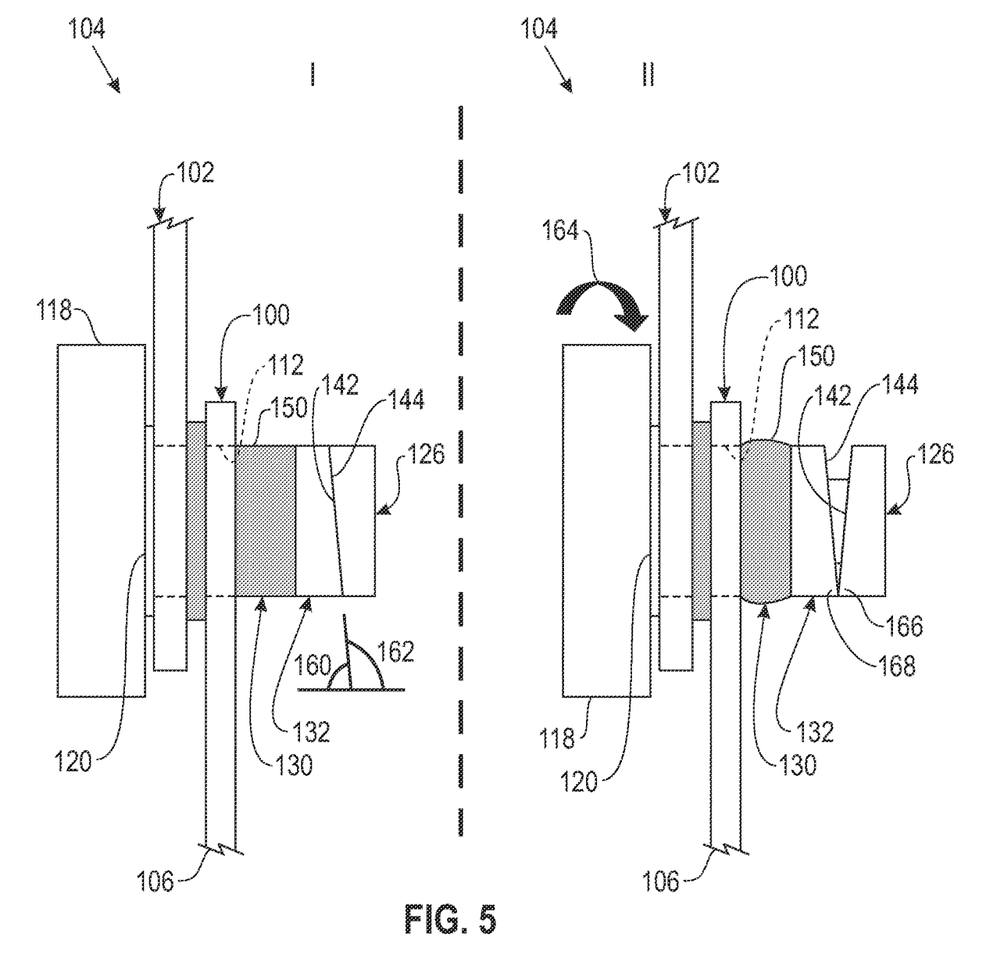
FIG. 5 is two top views of the connection of the server assembly to the server rack using the fastener, in accordance with an embodiment of the present disclosure.

FIG. 5 is two top views of the connection of server assembly 102 to server rack 100 using fastener 104. In the illustrated embodiment of View I, fastener 104 has been positioned through hole 112 in rail 106 of server rack 100. Fastener 104 is in an unlocked configuration wherein bar 126 and washer 132 are aligned so that faces 142 and 144 have supplementary angles 160 and 162, respectfully.

In the illustrated embodiment of View II, knob 118 has been turned one-hundred-eighty degrees by a user (not shown) in direction 164, which also rotated bar 126. This rotation misaligns faces 142 and 144, so their peaks 166 and 168, respectively, are rotated towards each other. This causes each peak 166 and 168 to ride along the inclined faces 142 and 144, respectively, which increases the distance between the inner end of bar 126 and the outer end of washer 132. This movement compresses bushing 130 such that collar 150 balloons outward to exert force on rail 106 (where rail 106 and collar 150 overlap), and, farther inward on bushing 130, collar 150 expands to a size that is larger than hole 112. This locked configuration of fastener 104 connects server assembly 102 and server rack 100 together. Because bar 126 and washer 132 are comprised of hard, slick materials and bushing 130 is comprised of a softer, tackier material, the coefficient of friction between bar 126 and washer 132 is lower than the coefficient of friction between washer 132 and bushing 130. Therefore, the frictional force between bushing 130 and washer 132 holds washer 132 substantially stationary (in the rotational sense, by overcoming the frictional force between bar 126 and washer 132) despite bar 126 being rotated.

The components and configuration of fastener 104 provide shock and vibration (S&V) isolation for server assembly 102 with respect to server rack 100 (for example, during shipping). This is accomplished because server assembly 102 does not directly contact server rack 100. Instead, bushing 130 is positioned between them, and bushing 130 is comprised of a vibration damping material. Since the vibrational forces from server rack 100 can be in the range of 1-2 G-forces, wired electrical connections and coolant connections to server assembly 102 may otherwise be damaged or disconnected but for fasteners 104.

Furthermore, the expansion of collar 150 allows for fastener 104 to be used in holes 112/212 and 114 of different shapes (as shown in FIGS. 2A and 2B) since bushing 130 will conform to the shape of the openings. In addition, the structural connection of server assembly 102 to server rack 100 can be done solely from the front side of the unit. This is advantageous compared to a more traditional nut-and-bolt configuration that requires a user to access the outside and the inside of server rack 100 simultaneously, and since fasteners 104 are captured by server assembly 102 during preassembly, there are no small parts to drop when fastening server assembly 102 to server rack 104.

FIG. 5 shows one embodiment of the present disclosure, to which there can be modifications. For example, angles 160 and 162 can be adjusted depending on, for example, the diameters of holes 112/212 and/or the amount of compression load desired. For another example, the amount of rotation required to lock fasteners 104 can be less than one-hundred-eighty degrees (e.g., between ninety and one-hundred-eighty degrees) so that rapid visual determination of the connection status can be determined. Having the locked position being less than one-half turn may naturally be the case due to manufacturing tolerances, although it could be purposefully induced, for example, using a compound or variable shape of faces 142 and/or 146. For example, a flat portion that is perpendicular to axis 134 (shown in FIG. 3A) could be added to the peak of on one or both of faces 142 and 146. Such a feature would provide an orientation for bar 126 where fastener 104 would be locked without contact between two inclined portions of faces 142 and 146 (since having contact between two inclined portions of faces 142 and 146 generates a rotational force urging fastener 104 to unlock). However, such a configuration would lessen the travel available between the locked and unlocked configurations, which could make knob 118 more difficult to turn. Such a situation could be alleviated by making pad 120 out of a low-friction material and/or lubricating the interface between pad 120 and server assembly 102.

Another way to prevent fastener 104 from unlocking unintentionally can be to add slip-resistant material and/or texture to one or more of wing 116, pad 120, face 142, and face 146. Such texture could be directional in that it would be easier to lock fastener 104 than to unlock fastener 104. Such features can be combined with a compound shape of faces 142 and/or 146 discussed above.

Figure 6:
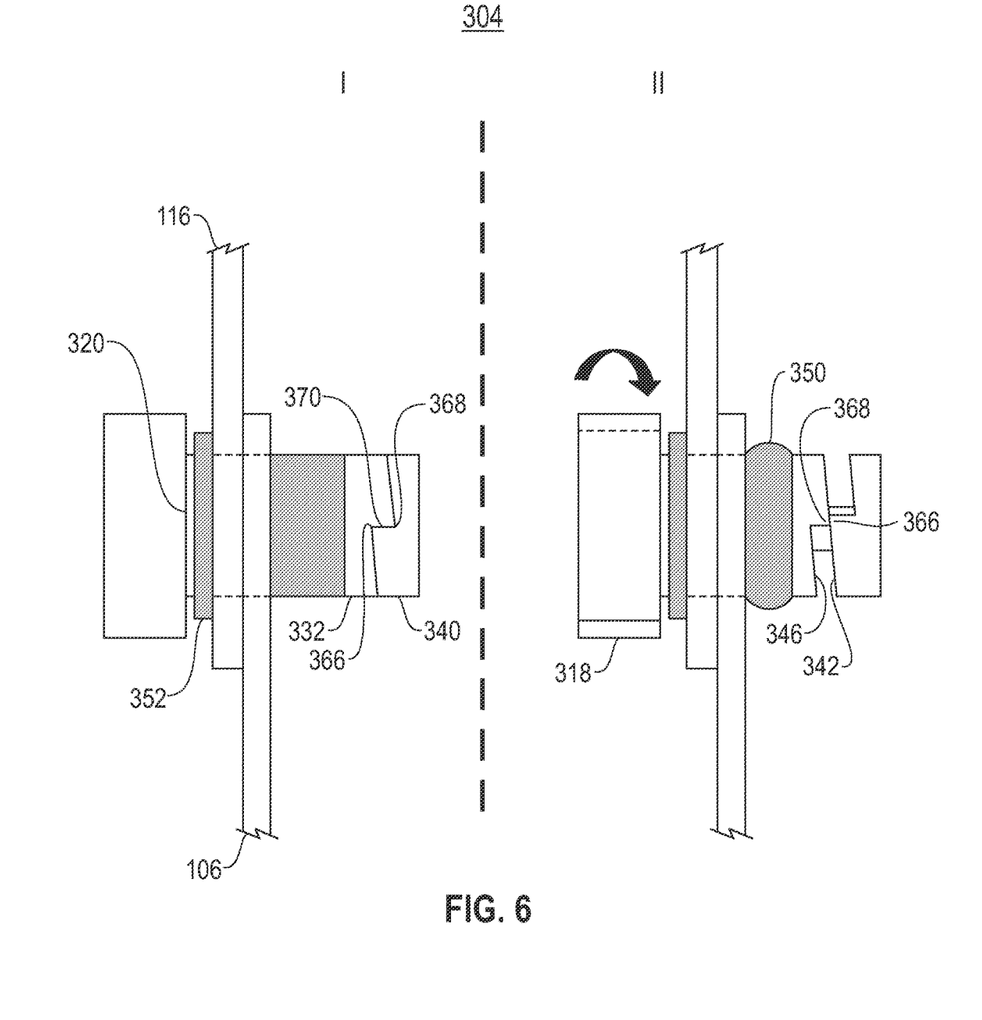
FIG. 6 is two views of the connection of the server assembly to the server rack using an alternate embodiment fastener, in accordance with an embodiment of the present disclosure.

FIG. 6 is two views of the connection of server assembly 102 to server rack 100 using an alternate embodiment fastener 304. In the illustrated embodiment, fastener 304 is assembled differently than fastener 104 (shown in FIG. 5) in that flange 352 is positioned between pad 320 and wing 116. This provides a more rigid connection between wing 116 and rail 106. Collar 350 functions the same way as collar 150 (shown in FIG. 5) in that it balloons up against rail 106, although it also exerts outward force on wing 116.

In the illustrated embodiment, faces 342 and 346 have corresponding helictical shapes that extend around head 340 and washer 332, respectively. At the outward end of faces 342 and 346 are peaks 366 and 368, respectively. Because faces 342 and 346 do not overlap themselves, respectively, peaks 366 and 368 include discontinuities 370, which are portions of faces 342 and 346 that extend axially instead of helically. In other words, because faces 342 and 346 do not continue to spiral around and around, discontinuities 370 allow faces 342 and 346 to return to their starting location from peaks 366 and 368, respectively. Thereby, knob 318 can be turned from the unlocked position (as shown in View I) to a locked position (as shown in View II) with a less than three-hundred-sixty degrees rotation. However, fastener 304 will become unlocked again once the knob completes a full rotation due to discontinuities 370 passing each other. Such a configuration can increase the amount of compression of collar 150 and/or decrease the rate of compression per degree of rotation depending on the slope of helictical faces 342 and 346. This is because there is almost three-hundred-sixty degrees of variable displacement to faces 342 and 346, as opposed to one-hundred-eighty degrees (or less) with faces 142 and 146 (shown in FIG. 5). While FIG. 6 shows one alternate embodiment fastener 304, the features of fastener 104 and 304 can be selectively combined, as appropriate, to benefit a given implementation.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A fastener system comprising:
   a bar extending along an axis, the bar including a catch at a first end and a head at a second end, wherein the head includes a first inclined face;

a knob configured to engage with the catch to prevent relative rotation between the knob and the bar and to prevent separation of the knob and the bar along the axis;

a bushing comprised of an elastomeric material that is positioned around the bar between the catch and the head, wherein the bushing includes a flange facing the knob; and a washer positioned around the bar between the bushing and the head, wherein the washer includes a second inclined face that contacts the first inclined face, wherein a coefficient of friction between the bushing and the washer is higher than a coefficient of friction between the washer and the head.

2. The fastener system of claim 1, wherein the first inclined face is a first flat bevel that is non-perpendicular with respect to the axis.

3. The fastener system of claim 2, wherein the second inclined face is a second flat bevel that is non-perpendicular with respect to the axis and is a supplementary angle with that of the first flat bevel when the bushing is uncompressed.

4. The fastener system of claim 1, wherein the first inclined face has a first helical shape that extends around the head once with a discontinuity extending along the axis.

5. The fastener system of claim 4, wherein the second inclined face has a second helical shape that extends around the washer and corresponds with the first helical shape.

6. The fastener system of claim 1, wherein the knob further comprises a pad configured to increase a contact area of the knob against a flat member.

7. The fastener system of claim 1, wherein the catch comprises a toggle that is rotatably connected to the bar and is configured to engage the knob.

8. The fastener system of claim 1, wherein when the washer is in contact with the head and the bushing is in contact with the washer, there is a gap between the flange and the knob configured to accommodate a flat member with a hole that the bar would pass through but that the knob or the bushing would not pass through.

9. A server rack comprising:
a base;
a plurality of rails extending from the base; and
a server assembly connected to the rails by a plurality of fasteners, wherein each fastener extends through a wing on the server and one of the plurality of rails, and wherein each fastener comprises:
a bar extending along an axis, the bar including a catch at a first end and a head at a second end, wherein the head includes a first inclined face;
a knob configured to engage with the catch to slidably connect the knob and the bar;
a bushing comprised of an elastomeric material that is positioned around the bar between the catch and the head; and
a washer positioned around the bar between the bushing and the head, wherein the washer includes a second inclined face that contacts the first inclined face,
wherein a coefficient of friction between the bushing and the washer is higher than a coefficient of friction between the washer and the head.

10. The server rack of claim 9, wherein the bushing includes a flange facing the knob.

11. The server rack of claim 10, wherein the flange is positioned between the wing and the one of the plurality of rails.

12. The server rack of claim 10, wherein the flange is positioned between the wing and the knob.

13. The server rack of claim 10, wherein the bar extends through a first hole in the wing on the server assembly and through a second hole in the one of the plurality of rails.

14. The server rack of claim 13, wherein the head is oriented with respect to the washer such that the first inclined face and the second inclined face are misaligned such that the bushing is elastically deformed to contact an inside of the second hole to secure the server assembly to the one of the plurality of rails.

15. The server rack of claim 9, wherein the wing is positioned between the knob and the one of the plurality of rails.

16. The server rack of claim 9, wherein the first inclined face is a first flat bevel that is non-perpendicular with respect to the axis.

17. The server rack of claim 9, wherein the first inclined face has a helical shape that extends around the head once with a discontinuity extending along the axis.

18. A server assembly comprising:
an electronic component;
a chassis housing the electronic component, the chassis comprising a wing extending outwards with an aperture;
a fastener extending through the aperture, wherein the fastener comprises:
a bar extending along an axis, the bar including a catch at a first end and a head at a second end, wherein the head includes a first inclined face;
a knob configured to engage with the catch to prevent relative rotation between the knob and the bar and to prevent separation of the knob and the bar along the axis;
a bushing comprised of an elastomeric material that is positioned around the bar between the catch and the head, wherein the bushing includes a flange facing the knob; and
a washer positioned around the bar between the bushing and the head, wherein the washer includes a second inclined face that contacts the first inclined face,
wherein a coefficient of friction between the bushing and the washer is higher than a coefficient of friction between the washer and the head, and wherein the fastener is retained by the wing due to the wing being positioned between the knob and the flange, and due to the aperture being smaller than the knob and the flange.

19. The server assembly of claim 18, wherein the first inclined face is a first flat bevel that is non-perpendicular with respect to the axis.

20. The server assembly of claim 18, wherein the first inclined face has a first helical shape that extends around the head once with a discontinuity extending along the axis.

* * * * *